(12) United States Patent
Rafferty et al.

(10) Patent No.: US 7,629,661 B2
(45) Date of Patent: Dec. 8, 2009

(54) SEMICONDUCTOR DEVICES WITH PHOTORESPONSIVE COMPONENTS AND METAL SILICIDE LIGHT BLOCKING STRUCTURES

(75) Inventors: Conor S. Rafferty, Newtown, MA (US); Clifford King, Gloucester, MA (US)

(73) Assignee: Noble Peak Vision Corp., Wakefield, MA (US)

( * ) Notice: Subject to any disclaimer, the term of this patent is extended or adjusted under 35 U.S.C. 154(b) by 333 days.

(21) Appl. No.: 11/351,638

(22) Filed: Feb. 10, 2006

(65) Prior Publication Data

US 2007/0187796 A1 Aug. 16, 2007

(51) Int. Cl.
*H01L 31/062* (2006.01)
*H01L 31/113* (2006.01)

(52) U.S. Cl. .................. 257/435; 257/459; 257/431; 257/E31.127; 257/E31.113; 257/E31.04; 257/290; 257/291; 257/292; 257/293; 257/E31.032

(58) Field of Classification Search .................. 257/444, 257/436, 233, 437, 433, 435, 222, 225, 294, 257/466, 414, 431, 434, 490, 290–293, E31.127, 257/E31.113, E31.04, E31.032, 459
See application file for complete search history.

(56) References Cited

U.S. PATENT DOCUMENTS

| 5,447,117 A | | 9/1995 | Yonehara et al. |
| 5,467,204 A | | 11/1995 | Hatano et al. |
| 5,525,828 A | | 6/1996 | Bassous et al. |
| 5,654,565 A | * | 8/1997 | Hokari .................. 257/222 |
| 5,796,154 A | * | 8/1998 | Sano et al. .................. 257/432 |
| 5,801,399 A | * | 9/1998 | Hattori et al. .................. 257/69 |

(Continued)

FOREIGN PATENT DOCUMENTS

| JP | 62-291957 | 12/1987 |
| JP | 2004140152 A | 5/2004 |
| WO | 03000019 A2 | 1/2003 |
| WO | 03000019 A3 | 1/2003 |
| WO | WO 2004/008537 A2 | 1/2004 |

OTHER PUBLICATIONS

GPD Germanium Photodetector Data Sheet, device GM8VHR, GPD Optoelectronics Corp., pp. 1-12.

(Continued)

*Primary Examiner*—Phat X Cao
*Assistant Examiner*—Diana C Garrity
(74) *Attorney, Agent, or Firm*—Wolf, Greenfield & Sacks, P.C.

(57) ABSTRACT

In accordance with the invention, a photonic device comprises a semiconductor substrate including at least one circuit component comprising a metal silicide layer and an overlying layer including at least one photoresponsive component. The metal silicide layer is disposed between the circuit component and the photoresponsive component to prevent entry into the circuit component of light that penetrates the photoresponsive component. The silicide layer advantageously reflects the light back into the photoresponsive element. In addition, the overlying layer can include one or more reflective layers to reduce entry of oblique light into the photoresponsive component. In an advantageous embodiment, the substrate comprises single-crystal silicon including one or more insulated gate field effect transistors (IGFETs), and/or capacitors, and the photoresponsive element comprises germanium and/or germanium alloy epitaxially grown from seeds on the silicon. The metal silicide layer can comprise the gate of the IGFET and/or an electrode of the capacitor.

30 Claims, 4 Drawing Sheets

U.S. PATENT DOCUMENTS

| | | | | |
|---|---|---|---|---|
| 6,043,547 | A * | 3/2000 | Hsia et al. | 257/437 |
| 6,091,093 | A * | 7/2000 | Kang et al. | 257/292 |
| 6,111,276 | A | 8/2000 | Mauk | |
| 6,492,701 | B1 * | 12/2002 | Kim et al. | 257/437 |
| 6,525,356 | B1 * | 2/2003 | Murakami et al. | 257/294 |
| 6,667,528 | B2 | 12/2003 | Cohen et al. | |
| 6,765,230 | B2 * | 7/2004 | Murade | 257/59 |
| 6,810,065 | B1 | 10/2004 | Naone | |
| 6,835,959 | B2 | 12/2004 | Ouchi | |
| 6,960,795 | B2 * | 11/2005 | Rhodes | 257/215 |
| 7,238,562 | B2 * | 7/2007 | Jang | 438/199 |
| 7,285,796 | B2 * | 10/2007 | Mouli | 257/53 |
| 7,385,270 | B2 * | 6/2008 | Ihara | 257/435 |
| 2002/0039833 | A1 | 4/2002 | Bensahel et al. | |
| 2003/0013218 | A1 | 1/2003 | Chason | |
| 2003/0137008 | A1 * | 7/2003 | Nozaki et al. | 257/347 |
| 2004/0121507 | A1 | 6/2004 | Bude et al. | |
| 2004/0248331 | A1 | 12/2004 | Cox et al. | |
| 2005/0104089 | A1 | 5/2005 | Engelman et al. | |
| 2005/0191062 | A1 | 9/2005 | Rafferty et al. | |
| 2005/0205954 | A1 | 9/2005 | King et al. | |
| 2006/0022233 | A1 * | 2/2006 | Rhodes | 257/292 |
| 2006/0086956 | A1 * | 4/2006 | Furukawa et al. | 257/291 |
| 2006/0267053 | A1 * | 11/2006 | Yang et al. | 257/291 |
| 2007/0114629 | A1 * | 5/2007 | Dosluoglu et al. | 257/435 |

OTHER PUBLICATIONS

Judson Technologies, LLc, Germanium Photodetector Data Sheet PB1600 (2000).

Masini et al., "High-Performance p-i-n Ge on Si Photodetectors for the Near Infrared: From Model to Demonstration," *IEEE Trans. Electronic Devices*, 48:6, 1092-1096 (2001).

Oh et al., "Interdigitated Ge p-i-n Photodetectors Fabricated on a Si Substrate Using Graded SiGe Buffer Layers," *IEEE Journal of Quantum Electronics*, 48:9, 1238-1241 (2002).

Shang et al., High Mobility p-channel Germanium MOSFET's with a Thin Ge Oxynitride Gate Dielectric, *IEDM Tech. Digest*, pp. 441-444 (2002).

Foreign Office Communication mailed Jul. 20, 2007.

Search Report and Written Opinion from PCT International Application No. PCT/US06/31591 mailed Nov. 2, 2007.

Colace et al., "Efficient High-Speed Near-Infrared Ge Photodetectors Integrated on Si Substrates," *Applied Physics Letters*, 76:10, 1231-1233 (2000).

* cited by examiner

SEMICONDUCTOR DEVICES WITH PHOTORESPONSIVE COMPONENTS AND METAL SILICIDE LIGHT BLOCKING STRUCTURES

STATEMENT OF GOVERNMENT INTEREST

The United States Government has certain rights in this invention pursuant to NSF Phase II SBIR Award DMI-0450487.

FIELD OF THE INVENTION

This invention relates generally to semiconductor photonic devices such as photodetectors for visible and infrared light. In particular, it concerns semiconductor dual layer photonic devices configured to enhance responsivity while reducing stray light.

BACKGROUND OF THE INVENTION

Semiconductor photonic devices are highly useful in a variety of applications ranging from monitoring, analyzing and imaging light to the generation of energy from solar radiation. Typically such devices comprise semiconductor photoresponsive components such as photodiodes, photoransistors or photoresistors integrated with semiconductor processing circuitry. Such devices can be used as photodetectors and solar cells.

Semiconductor photodetectors are widely used for the detection of light, both visible and infrared. They exploit the internal photoelectric effect, where electron-hole pairs are generated in a semiconductor by photon absorption and contribute to electrical conduction inside the device, leading to a corresponding current at the contacts of the detector. Such detectors are fabricated singly for monitoring, in linear arrays for spectroscopy, and in two-dimensional (2-D) arrays for imaging.

One approach to the fabrication of photonic devices is to integrate photoresponsive components, such as photodiodes, with components for processing circuitry, such as transistors and capacitors. Most commonly, the photoresponsive components and the processing components are formed in the same plane. In some variations, the processing components are formed in a semiconductor substrate and photoresponsive components are formed in a layer overlying the substrate. In such devices the photoresponsive components will have a finite thickness limited by several factors, including the time and conditions needed to deposit or grow the photoresponsive components, the height of metal contacts to the substrate, and the desired planarity of the overall integrated device. As a consequence, the photoresponsive components can absorb only a portion of the light falling on them, and some of the light can be transmitted through them without being absorbed. For light near the cutoff wavelength, photodetector absorption can be quite weak. For instance 20% might be reflected, 10% might be absorbed and 70% might be transmitted through the detector.

Light transmitted through the photoresponsive component can penetrate into the substrate, where it becomes stray light that can be absorbed (directly or after reflection) in the semiconductor circuitry, causing unexpected and undesired current to flow. Also, in a photodetector array, light that enters one photoresponsive component at an oblique angle may pass through it to another component in the array. Such stray light causes undesired crosstalk in an analyzer or blurring in an imager. Thus light that is not absorbed by the photoresponsive component can create three problems: it can degrade responsivity of the photoresponsive component, it can cause unwanted current to flow in the circuitry, and it can cause crosstalk. Accordingly there is a need for photonic devices that are configured to enhance responsivity while reducing stray light.

SUMMARY OF THE INVENTION

In accordance with the invention, a photonic device comprises a semiconductor substrate including at least one circuit component comprising a metal silicide layer and an overlying layer including at least one photoresponsive component. The metal silicide layer is disposed between the circuit component and the photoresponsive component to prevent entry into the circuit component of light that penetrates the photoresponsive component. The silicide layer advantageously reflects the light back into the photoresponsive element. In addition, the overlying layer can include one or more reflective layers to reduce entry of oblique light into the photoresponsive component. In an advantageous embodiment, the substrate comprises single-crystal silicon including one or more insulated gate field effect transistors (IGFETs), and/or capacitors, and the photoresponsive element comprises germanium and/or germanium alloy epitaxially grown from seeds on the silicon. The metal silicide layer can comprise the gate of the IGFET and/or an electrode of the capacitor.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1A:
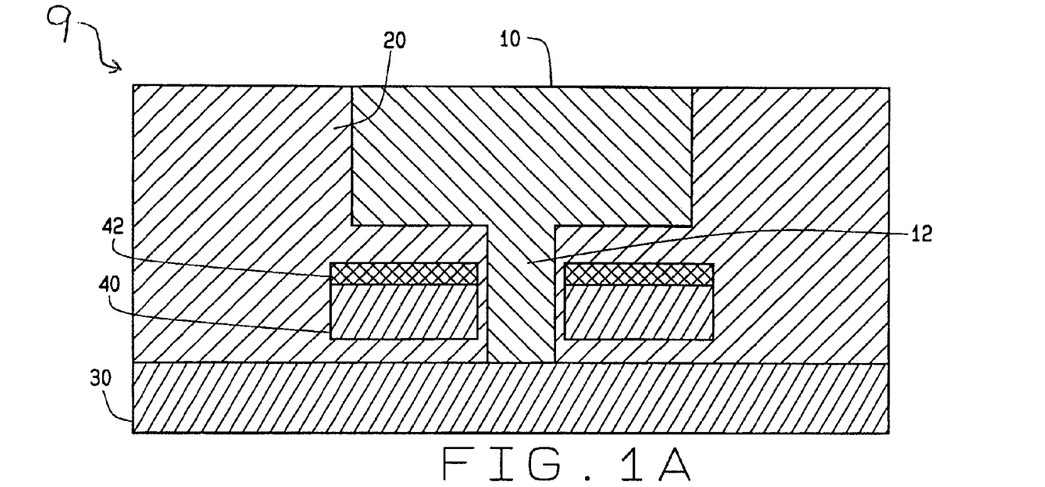
FIGS. 1A and 1B are cross sectional and plan views, respectively, of a first exemplary photonic device in accordance with the invention.
Figure 1B:
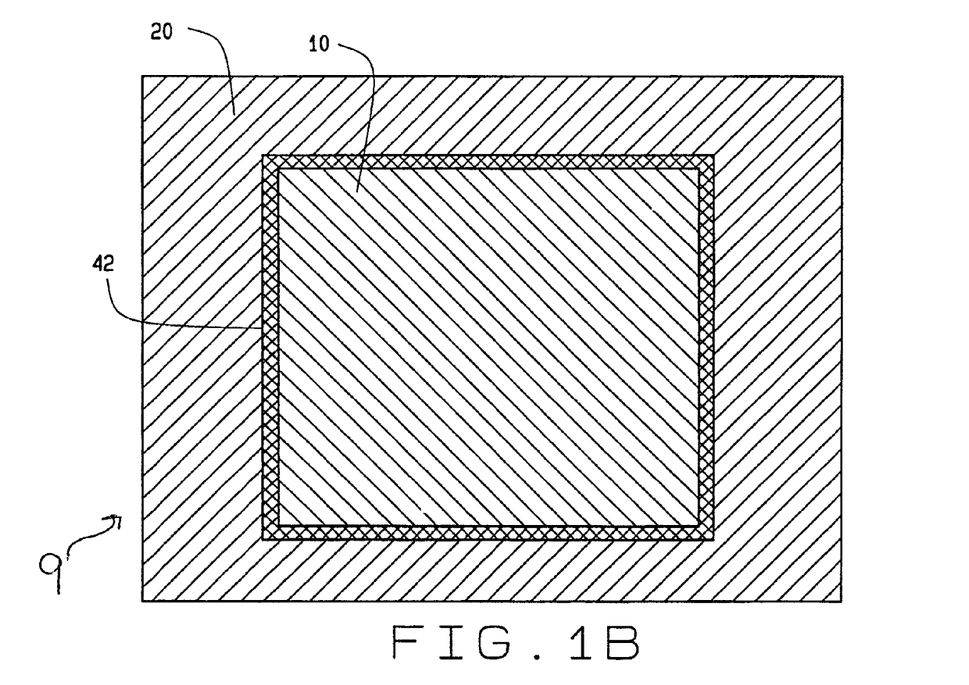

Referring to the drawings, FIGS. 1A and 1B schematically illustrate a photonic device 9 comprising a semiconductor substrate 30 and an overlying layer, such as insulating layer 20, including at least one semiconductor photoresponsive component 10. The substrate 30 includes at least one circuit component such as an insulated-gate field effect transistor including a source and a drain (not shown) underlying an insulated gate 40.

The photoresponsive component 10 advantageously overlies transistor insulated gate 40, and the gate 40 advantageously includes a layer 42 to prevent light that passes through the component 10 from entering the transistor region underlying the gate 40. Advantageously, the layer 42 also reflects the light back into the photoresponsive component 10.

In a preferred embodiment, the substrate 30 comprises single crystal silicon, the gate comprises polysilicon, the gate insulator comprises silicon oxide, and the layer 42 comprises metal silicide. The insulator layer 20 can comprise silicon oxide. The photoresponsive component 10 preferably comprises single-crystal germanium. The germanium can be grown from a seed stem 12 that is epitaxially grown from the silicon substrate 30. Alternatively, the photoresponsive component can comprise polycrystalline germanium, single crystal silicon, polycrystalline silicon, or alloys of silicon and germanium in either single crystal or polycrystalline form. This includes all Si/Ge alloys between pure Si and Ge.

As an exemplary process for fabricating the preferred device, a silicon substrate 30 can be processed in the usual way to create transistors and other desired circuitry. As part of the processing, polysilicon gates 40 are created. These gates have a metal silicide layer 42 formed on the upper surface. The polysilicon layer 40 which can be used as the gate of a transistor, can also be used as one plate of a capacitor whose other plate is the substrate below the polysilicon, or the polysilicon plate may be grounded.

After one or more transistors are created, they can be covered with a transparent dielectric layer. The photoresponsive component 10, made of crystalline or polycrystalline semiconductor material, can be formed on or in the dielectric. Dielectric layer 20 can then be deposited over the silicon substrate 30 and the transistor gate and be planarized.

In a preferred embodiment, the photoresponsive components comprise germanium islands 10 formed by epitaxy lateral overgrowth (ELO) from seed stems 12 using the substrate silicon as a template. The ELO technique is used to form a high quality germanium seed stem 12 embedded in the insulator 20 on top of the silicon substrate 30. As an example, insulator 20 can be formed as an oxide layer overlying a single crystal silicon substrate 30. Seed windows can be lithographically defined in the oxide and opened by etching down to the substrate. The exposed silicon surface can be cleaned for germanium growth. Then, germanium can be grown selectively on the exposed silicon by selective CVD growth. The growth should be continued until the germanium overgrows the seed stem 12 and fills the region of the island 10. The seed stems 12 and islands 10 can be shaped and dimensioned so that defects originating at the Ge/Si interface are terminated at the walls of stem 12 before reaching the germanium island 10. This provides a region of germanium over the oxide mask that is essentially defect-free. Further details concerning this technique are set forth in U.S. Patent Application Publication No. 2004/0121507 to Bude et al., herein incorporated by reference. Alternatively, the photoresponsive component might comprise epitaxially grown silicon, polysilicon or polygermanium material deposited and patterned using standard semiconductor processing techniques. The photoresponsive component can be processed in accordance with well known techniques to form a photodiode, phototransistor or photosensitive resistor.

The gate 40/42 underneath the photodetector is preferably sized and dimensioned to completely overlap the bottom of the photoresponsive component 10. If a seed is used, the gate can be shaped around the stem (e.g. donut-shaped) to allow the seed stem to penetrate through it.

In operation, light is incident from above. If light is not absorbed in the photoresponsive component and is transmitted through it, the metal silicide 42 will prevent the light from penetrating into the transistor gate and advantageously, will reflect it back through the photoresponsive component 20, where it will have a chance to be absorbed on the second pass. Thus for low levels of absorption, the probability of absorption will be approximately doubled. For high levels of absorption, virtually all the light incident on the component will be absorbed. Light that is not absorbed does not reach the substrate.

Figure 2A:
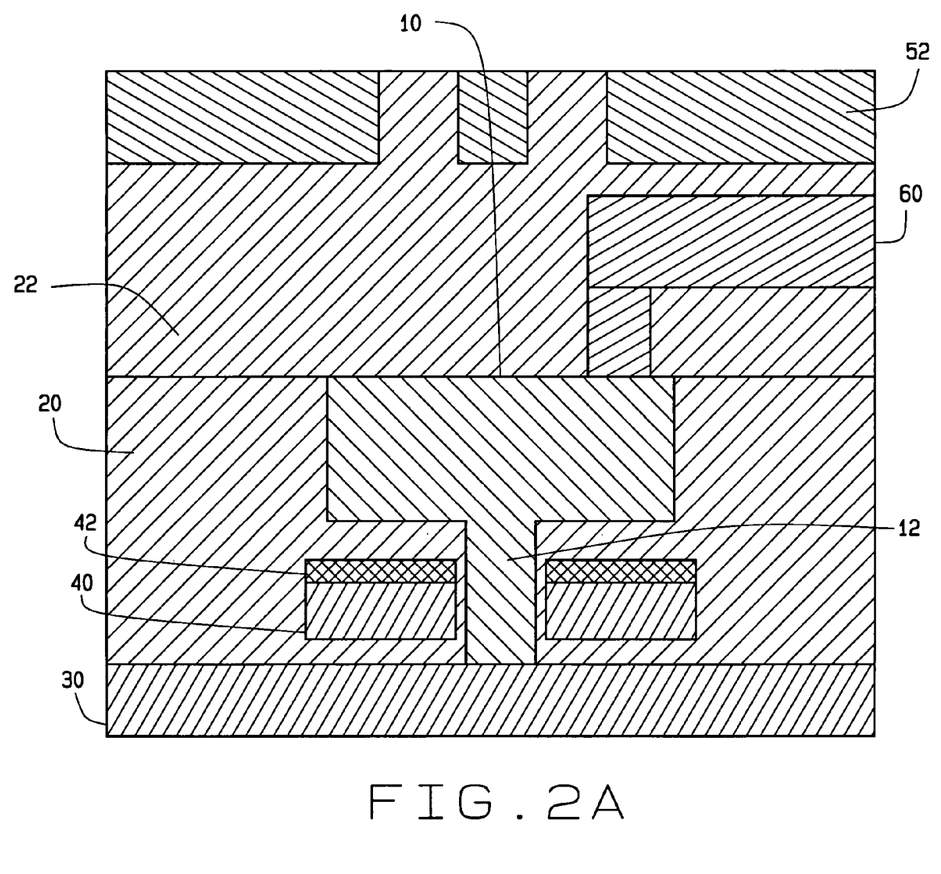
FIGS. 2A and 2B are cross sectional and plan views of the device of FIG. 1 including higher layers of metal.
Figure 2B:
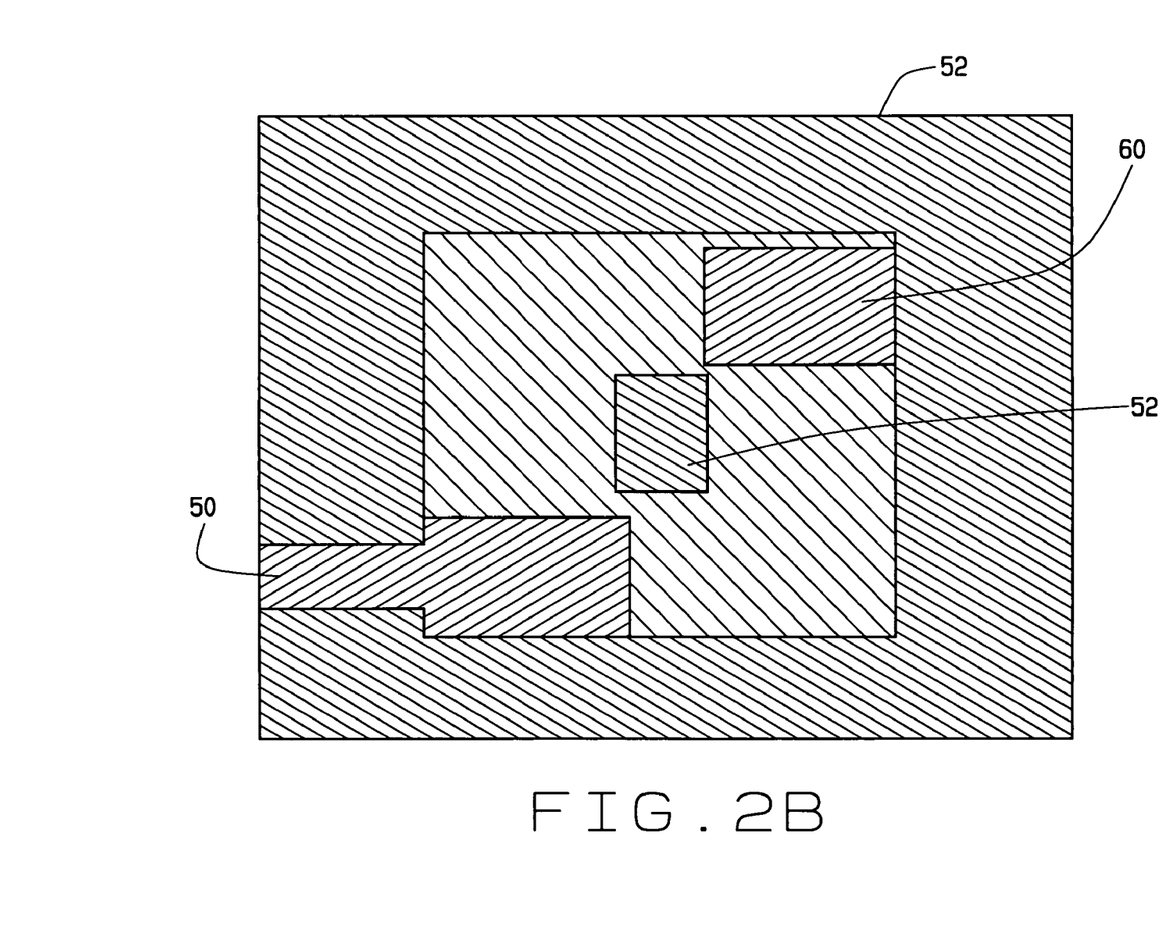

FIGS. 2A (cross-section) and 2B (plan-view) shows the device of FIG. 1 provided with higher levels of metal. Metal wires 50 embedded in the upper level dielectric 22 are provided to contact the photoresponsive component, and will block oblique light to the underlying substrate. The dielectric 22 may or may not be the same as dielectric 20. A level of metal 52 higher in level than the metal 50 can be used as a light shield for the substrate. This light shield will have openings only above the photonic device in order to prevent oblique light from reaching the substrate. The light shield can have breaks above another metal layer as shown in FIG. 2B, since the lower metal will reflect light. An extra piece of light shield 52 can be disposed overlying the stem 12 in order to block light that might pass from the stem to substrate.

The silicide coated gate is sandwiched between the semiconductor substrate in which the transistor is formed and the photoresponsive component is formed in a higher level. By blocking light which passes through the component, it prevents transmitted light from reaching the substrate and inducing unwanted currents in the circuits, thus acting as a light shield. It can also reflect light back into the photoresponsive component.

Figure 3:
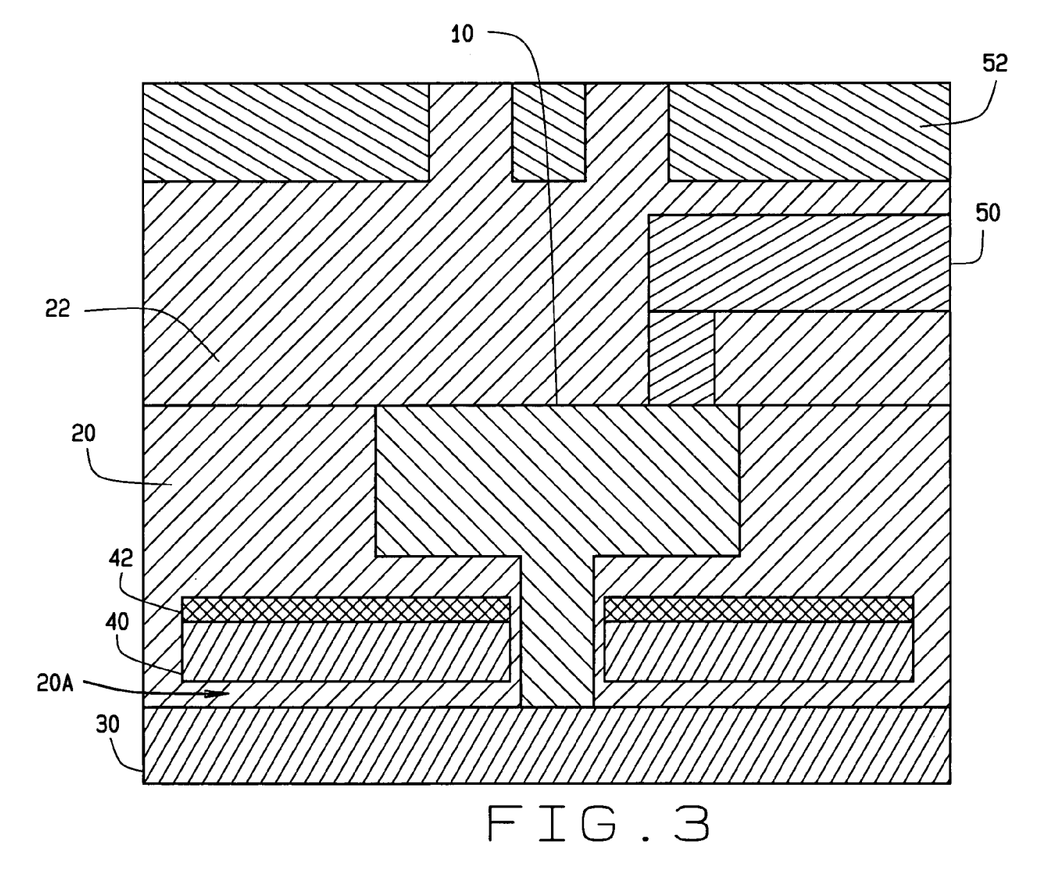
FIG. 3 is a cross-sectional view of an alternative photonic device in accordance with the invention.

FIG. 3 illustrates an alternative photonic device in accordance with the invention where the circuit component is a capacitor underlying photoresponsive component 10. The capacitor is composed of polysilicon electrode 40, substrate electrode 30 and an intervening layer of insulator 20A. The polysilicon electrode 40 is covered with a layer of metal silicide 42 to block from the underlying region of the capacitor light that passes through the overlying photoresponsive component 10. Advantageously, the metal silicide layer 42 is peripherally larger than the photoresponsive component. Higher layers of metal 50,52 are advantageously configured to block oblique light from the device.

It can now be seen that in one broad aspect, the invention is a photonic device comprising a semiconductor substrate including at least one circuit component. Overlying the substrate is a layer comprising at least one photoresponsive component that overlaps the circuit component. The circuit component comprises a metal silicide layer positioned to block from the circuit component light passing through the photoresponsive component. Advantageously the metal silicide reflects light back into the photoresponsive component. The semiconductor substrate is advantageously a single-crystal semiconductor, preferably silicon. The circuit component is advantageously an IGFET or a capacitor. The layer overlying the substrate is advantageously an insulating layer such as silicon oxide, and the photoresponsive component advantageously comprises a semiconductor, such as germanium. The metal silicide can be part of the gate of the IGFET and/or an electrode of the capacitor.

The photoresponsive component is preferably epitaxial with the semiconductor substrate. The component can comprise a stem region of a first lateral area and thickness epitaxially grown from the substrate and a larger lateral area island region epitaxially grown from the stem region. The area and vertical thickness of the stem region can be chosen to grow an island region substantially free of dislocation defects arising from the substrate interface.

In an advantageous embodiment, the metal silicide is peripherally larger than the photoresponsive component covers the underlying portions of the circuit component to block stray light from the underlying portions.

Such photodetectors can be utilized individually, as for light monitoring, or a plurality of such photodetectors can be disposed in a one-dimensional (linear) array, as for spectroscopy, or in a two-dimensional array, as for imaging.

Reflective layers, such as metal, can be disposed and patterned on the layer overlying the substrate. The reflective layers, in combination with the metal silicide, can be configured to substantially preclude light from the circuit components in the substrate. Where the photoresponsive component includes a stem, a region of reflective layer can be vertically aligned with the stem region.

It is to be understood that the above-described embodiments are illustrative of only a few of the many possible embodiments which can represent applications of the invention. Numerous and varied other arrangements can be made by those skilled in the art without departing from the spirit and scope of the invention.

APPENDIX OF REFERENCES

G. Masini, L. Colace, G. Assanto, H.-C. Luan, and L. C. Kimmerling, "Highperformance p-i-n Ge on Si photodetectors for near infrared, from model to demonstration," IEEE Trans. Electron Devices, vol. 48, no. 6, pp. 1092, 2001.

J. Oh, J. C. Campbell, S. G. Thomas, B. Bharatan, R. Thoma, C. Jasper, R. E. Jones, and T. E. Zirkle, "Interdigitated Ge p-i-n photodetectors fabricated on a Si substrate using graded SiGe buffer layers," IEEE Journal of Quantum Electronics, vol. 38, no. 9, pp. 1238, 2002.

GPD Germanium Photodetector Data sheet, device GM8VHR

Judson Technologies Germanium Photodetector Data sheet PB1600

H. Shang, H. Okorn-Schmidt, K. K. Chan, M. Copel, J. Ott, P. M. Kozlowski, S. E. Steen, S. A. Cordes, H.-S. P. Wong, E. C. Jones, and W. E. Haensch, "High mobility p-channel Ge MOSFET's with a thin Ge oxynitride gate dielectric," in IEDM Tech. Digest, 2002, pp. 441-444.

What is claimed is:

1. An apparatus comprising:
    a semiconductor substrate comprising at least one circuit component;
    a photoresponsive component overlying at least part of the substrate, the photoresponsive component having a first surface configured to receive incident radiation, the first surface having a first surface area; and
    a metal silicide layer disposed at least partially between the photoresponsive component and the at least one circuit component, the metal silicide layer having a second surface, the second surface having a second surface area greater than the first surface area,
    wherein the metal silicide layer comprises a first opening, and wherein a portion of the photoresponsive component passes through the first opening.

2. The apparatus of claim 1, wherein the first surface has a first periphery, and wherein the second surface has a second periphery larger than the first periphery.

3. The apparatus of claim 1, wherein the semiconductor substrate comprises silicon.

4. The apparatus of claim 3, wherein the photoresponsive component comprises a silicon-germanium alloy.

5. The apparatus of claim 3, wherein the photoresponsive component comprises germanium.

6. The apparatus of claim 5, wherein the photoresponsive component comprises single crystal germanium and the semiconductor substrate comprises single crystal silicon.

7. The apparatus of claim 1, wherein the photoresponsive component comprises a stem region connected to the semiconductor substrate, and wherein the portion of the photoresponsive component passing though the first opening comprises the stem region.

8. The apparatus of claim 7, wherein the photoresponsive component comprises germanium and the semiconductor substrate comprises silicon.

9. The apparatus of claim 7, further comprising a light blocking segment comprising metal, the light blocking segment overlying the first surface of the photoresponsive component and configured to preclude light incident on the apparatus from reaching the stem region.

10. The apparatus of claim 1, further comprising a light blocking segment comprising metal, the light blocking segment overlying the first surface of the photoresponsive component and configured to preclude at least a portion of light incident on the apparatus from reaching the first surface of the photoresponsive component.

11. The apparatus of claim 1, wherein the metal silicide layer is configured to preclude substantially all light passing through the photoresponsive component from reaching the semiconductor substrate.

12. A device comprising:
    a semiconductor substrate comprising at least one circuit component;
    a first layer overlying the semiconductor substrate and comprising at least one photoresponsive component; and
    a metal silicide layer configured to substantially preclude light passing through the at least one photoresponsive component from reaching the at least one circuit component;
    wherein the at least one photoresponsive component comprises a semiconductor;
    wherein the semiconductor substrate comprises a single crystal semiconductor and the at least one photoresponsive component comprises a single crystal semiconductor epitaxially grown from the semiconductor substrate;
    wherein the at least one photoresponsive component comprises a stem region having a first lateral area, the stem region epitaxially grown from the semiconductor substrate, and wherein the at least one photoresponsive component further comprises an island having a second lateral area larger than the first lateral area, the island grown from the stem region, and wherein the island is substantially free of defects;
    wherein the first layer overlying the semiconductor substrate further comprises a reflective layer and wherein a portion of the reflective layer substantially precludes light from the stem region;
    wherein the reflective layer comprises a portion disposed above the stem region and vertically aligned with the stem region.

13. The device of claim 12 wherein the at least one circuit component comprises an insulated gate field effect transistor having a gate electrode and the gate electrode includes the metal silicide layer.

14. The device of claim 12 wherein the at least one circuit component comprises a capacitor having a pair of electrodes and at least one electrode of the pair of electrodes includes the metal silicide layer.

15. The device of claim 12 wherein the first layer overlying the semiconductor substrate comprises an insulating material.

16. The device of claim 12 wherein the at least one photoresponsive component comprises a different semiconductor than the substrate.

17. The device of claim 12 wherein the semiconductor substrate comprises single crystal silicon.

18. The device of claim 17 wherein the at least one photoresponsive component comprises silicon.

19. The device of claim 17 wherein the at least one photoresponsive component comprises germanium.

20. The device of claim 17 wherein the at least one photoresponsive component comprises an alloy of silicon and germanium.

21. The device of claim 12 wherein the metal silicide layer has a lateral area larger than the second lateral area of the island.

22. The device of claim 12, wherein the at least one circuit component comprises an insulated gate field effect transistor having a gate electrode, and wherein the semiconductor substrate comprises single crystal silicon, the gate electrode comprises polysilicon, and the first layer overlying the substrate comprises silicon oxide.

23. The device of claim 12 wherein the at least one photoresponsive component comprises single crystal germanium.

24. The device of claim 12, in combination with at least one circuit component contacting the at least one photoresponsive component to form a photodetector.

25. The device of claim 12, wherein the at least one photoresponsive component comprises a first photoresponsive component, and wherein the device further comprises a plurality of additional photoresponsive components arranged in a linear array along with the first photoresponsive component, and wherein the first photoresponsive component and each of the plurality of additional photoresponsive components is a photodetector.

26. The device of claim 12, wherein the at least one photoresponsive component comprises a first photoresponsive component, and wherein the device further comprises a plurality of additional photoresponsive components arranged in a two-dimensional array along with the first photoresponsive component, and wherein the first photoresponsive component and each of the plurality of additional photoresponsive components is a photodetector.

27. The device of claim 12, further comprising circuitry connected to the at least one photoresponsive component, the circuitry and at least one photoresponsive component forming at least part of a solar cell.

28. A device according to claim 12 wherein the at least one photoresponsive component comprises a photodiode.

29. A device according to claim 12 wherein the at least one photoresponsive component comprises a phototransistor.

30. A device according to claim 12 wherein the at least one photoresponsive component comprises a photosensitive resistor.

* * * * *

UNITED STATES PATENT AND TRADEMARK OFFICE
CERTIFICATE OF CORRECTION

PATENT NO. : 7,629,661 B2  Page 1 of 1
APPLICATION NO. : 11/351638
DATED : December 8, 2009
INVENTOR(S) : Conor S. Rafferty et al.

It is certified that error appears in the above-identified patent and that said Letters Patent is hereby corrected as shown below:

On the Title Page, Item (75) Inventors: "Conor S. Rafferty, Newtown, MA (US)" should read --Conor S. Rafferty, Newton, MA (US)--.

On the Title Page:

The first and sole Notice should read --

Subject to any disclaimer, the term of this patent is extended or adjusted under 35 U.S.C. 154(b) by 409 days.

Claim 7, column 6, line 2, "though" should read --through--.

Signed and Sealed this

Twenty-first Day of September, 2010

David J. Kappos
*Director of the United States Patent and Trademark Office*